United States Patent
Chow et al.

(10) Patent No.: US 9,967,035 B2
(45) Date of Patent: May 8, 2018

(54) METHOD AND CIRCUIT TO REDUCE POWER CONSUMPTION OF OPTICAL TRANSMITTER

(71) Applicant: Alcatel-Lucent USA Inc., Murray Hill, NJ (US)

(72) Inventors: Hungkei Chow, Murray Hill, NJ (US); Jie Li, Balwyn (AU); Ka Lun Lee, Southbank (AU)

(73) Assignee: Alcatel-Lucent USA Zinc., Murray Hill, NJ (US)

(\*) Notice: Subject to any disclaimer, the term of this patent is extended or adjusted under 35 U.S.C. 154(b) by 34 days.

(21) Appl. No.: 15/134,546

(22) Filed: Apr. 21, 2016

(65) Prior Publication Data

US 2016/0315713 A1 Oct. 27, 2016

Related U.S. Application Data (60) Provisional application No. 62/152,582, filed on Apr. 24, 2015.

(51) Int. Cl.

| | |
|---|---|
| *H04B 10/50* | (2013.01) |
| *H04B 10/564* | (2013.01) |
| *H04B 10/524* | (2013.01) |
| *H04L 7/00* | (2006.01) |
| *H01S 5/042* | (2006.01) |
| *H01S 5/062* | (2006.01) |

(52) U.S. Cl.
CPC ......... *H04B 10/564* (2013.01); *H01S 5/0427* (2013.01); *H04B 10/504* (2013.01); *H04B 10/524* (2013.01); *H04L 7/0075* (2013.01); *H01S 5/06213* (2013.01)

(58) Field of Classification Search
CPC ... H04B 10/564; H04B 10/504; H04B 10/524
See application file for complete search history.

(56) References Cited

U.S. PATENT DOCUMENTS

| 6,683,896 B2 | 1/2004 | Heilman et al. | |
|---|---|---|---|
| 2002/0122308 A1* | 9/2002 | Ikeda | H01S 5/0427 |
| | | | 362/259 |
| 2005/0029965 A1* | 2/2005 | Yamaguchi | G02B 26/12 |
| | | | 315/291 |
| 2006/0098701 A1* | 5/2006 | Hayashi | H01S 5/0427 |
| | | | 372/38.02 |
| 2007/0104232 A1 | 5/2007 | Baumgartner et al. | |
| 2015/0277207 A1* | 10/2015 | Fujikata | G02F 1/225 |
| | | | 385/3 |

FOREIGN PATENT DOCUMENTS

JP 200898657 A 4/2008

\* cited by examiner

*Primary Examiner* — Dzung Tran
(74) *Attorney, Agent, or Firm* — Parker Justiss, PC (57) ABSTRACT

Various embodiments of an optical transmitter and a method of operating an optical transmitter are disclosed. In one embodiment, the optical transmitter includes a laser and a laser driver configured to drive the laser using either a voltage driving topology (CDT) or a current-driving topology (VDT). The laser driver includes a switch that is configured to switch between the CDT and the CDT based on an operating frequency of the optical transmitter.

12 Claims, 6 Drawing Sheets

METHOD AND CIRCUIT TO REDUCE POWER CONSUMPTION OF OPTICAL TRANSMITTER

CROSS-REFERENCE TO RELATED APPLICATION

This application claims the benefit of U.S. Provisional Application Ser. No. 62/152,582, filed by Chow, et al., on Apr. 24, 2015, entitled "Method and Circuit to Reduce Power Consumption of Optical Transmitter," commonly assigned with this application and incorporated herein by reference.

TECHNICAL FIELD

This disclosure is directed to an optical communication system and, more specifically, to an optical transmitter and a method of operating thereof.

BACKGROUND

This section introduces aspects that may be helpful in facilitating a better understanding of the disclosure. Accordingly, the statements of this section are to be read in this light and are not to be understood as admissions about what is in the prior art or what is not in the prior art.

An optical transceiver is an integrated circuit that uses fiber optic technology to communicate among devices such as Digital Video Disc players and optical local area networks. An optical transceiver includes a transmitter that encodes a message into optical signal and a receiver that reproduces the message from the received optical signal. In an access network, an optical transceiver consumes a significant amount of power. It has been recognized that more than half of the power consumed by an optical transceiver is consumed by its transmitter.

SUMMARY

One aspect of this disclosure provides an optical transmitter. The optical transmitter includes a laser and a laser driver that is configured to drive the laser using either a voltage-driving topology or a current-driving topology. The laser driver includes a switch that is configured to switch between the voltage-driving topology and the current-driving topology based on an operating frequency of the optical transmitter.

Another aspect of this disclosure provides a method of operating an optical transmitter. The method includes driving a laser using one of topologies, which includes a voltage-driving topology and a current-driving topology. The method further includes switching to other one of the topologies based on an operating frequency of the optical transmitter.

Yet another aspect of this disclosure provides an optical transmitter. The optical transmitter includes a laser and a laser driver that is configured to drive the laser with a low bias current and a modified modulation current having a high start-up modulation current pulse.

Still yet another aspect of this disclosure provides a method of operating an optical transmitter. The method includes generating a modified modulation current with a high start-up modulation current pulse and driving a laser of the optical transmitter with a low bias current and the modified modulation current.

BRIEF DESCRIPTION

Some embodiments of apparatuses and/or methods in accordance with embodiments of this disclosure are now described, by way of example only, and with reference to the accompanying drawings, in which.

DETAILED DESCRIPTION

One of the ways to reduce the power consumption of an optical transmitter is reducing the transmitter's modulation current. While optimizing the modulation current based on the link condition may be effective in some instances, it has been recognized that changing the transmitter's laser driving topology from the conventional voltage-driving topology (VDT) to a current-driving topology (CDT) can be more effective.

The CDT uses less modulation current than the VDP because it lacks the VDT's parallel load matching resistor. But due to the absence of such a resistor, the CDT has higher output impedance and a smaller charging and discharging time constant and hence, a lower bandwidth than the VDT. As such, while the CDT consumes less power than the VDP, it is not a preferred topology for a high frequency/bandwidth operation, in which today's optical transmitters are often used.

Another way to reduce the power consumption of an optical transmitter is using a low bias current. But it has been recognized that driving an optical transmitter's laser with a low bias current, e.g., one that is lower than a threshold current of the laser and well below the typical bias current (1-4 mA), increases the laser's turn-on delay and thus limits its usage.

Introduced herein are various embodiments of an improved optical transmitter that reduces its power consumption without suffering from the above noted complications.

In one of the introduced embodiments, unlike the conventional transmitter that uses a VDT irrespective of its operation frequency/bandwidth, an optical transmitter is configured to switch between a CDT and a VDT based on an operating frequency/bandwidth of the transmitter. As such, the optical transmitter in this embodiment may switch to a CDT when the operation frequency/bandwidth falls below a certain level and switch to a VDT when the operation frequency/bandwidth is or above the certain level. As such, the transmitter would use the least amount of modulation current for each operating frequency/bandwidth and thus consume less power overall than the conventional transmitter.

In another embodiment, an optical transmitter is configured to drives its laser with a modified modulation current and a low bias current. The term "low bias current" in this disclosure refers to a current that is lower than a required turn-on threshold current of a laser. Typically, the low bias current would be well below the typical bias current of 1-4 mA of a laser and be zero or close to zero. Amplitude of the low bias current may be based on factors such as operating bandwidth and packet pattern.

In this embodiment, the modified modulation current would have a high start-up modulation (HSM) current portion at the beginning of its pulse/bit. Due to this HSM current portion, the transmitter reduces its turn-on delay that is related to the carrier density at the gain region at an arrival time of the step current-pulse. As such, the transmitter can quickly resume its laser driver with the low bias current without suffering from the extended turn-on delay.

Figure 1:
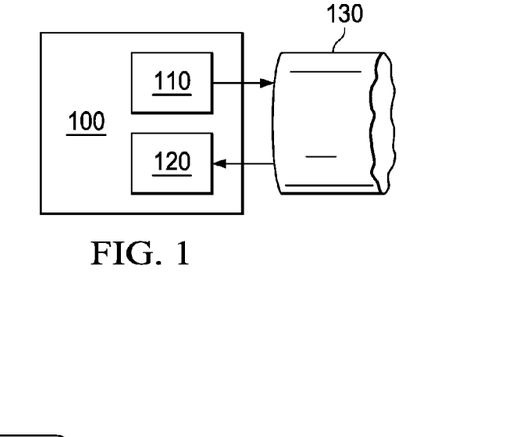
FIG. 1 illustrates a block diagram of one embodiment of an optical transceiver implemented according to the principle of the disclosure.

FIG. 1 illustrates one embodiment of an optical transceiver 100 in an optical communication system. In the illustrated embodiment, the optical transceiver 100 includes an optical transmitter 110 and an optical receiver 120. The transmitter 110 transmits a converted optical output (from an electrical input) to a receiver on the other end of the transmission medium 130, e.g., fiber, and the receiver 120 receives an optical output from a transmitter on the other end of the medium. While the transmitter 110 and the receiver 120 are illustrated as a part of the optical transceiver 100, they may be implemented separately.

Figure 2:
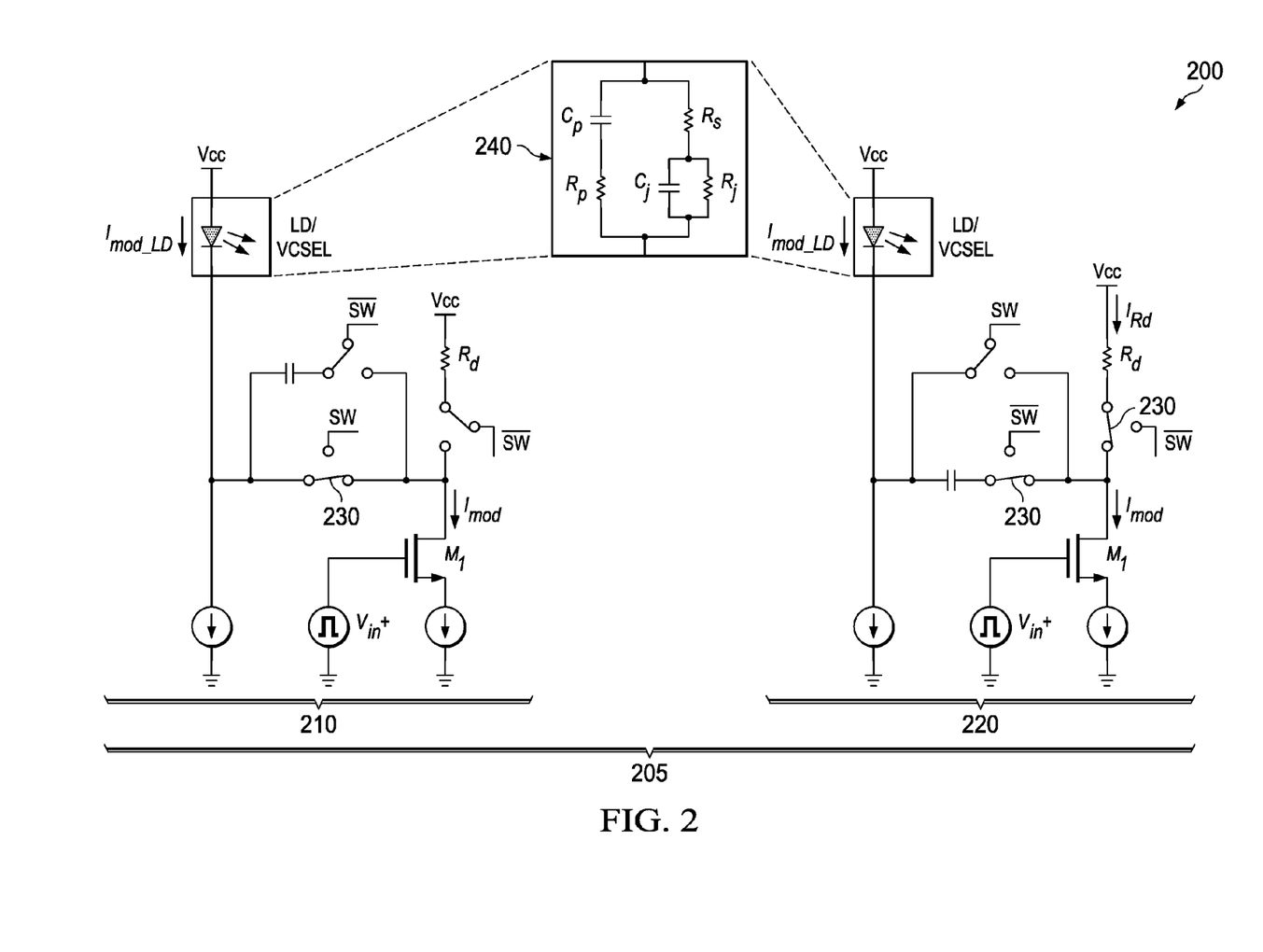
FIG. 2 illustrates a circuit diagram of one embodiment of an optical transmitter in an optical transceiver, e.g., the optical transceiver in FIG. 1, implemented according to the principle of the disclosure.

FIG. 2 illustrates an embodiment of an optical transmitter 200, e.g., the optical transmitter 100 in FIG. 1. In the illustrated embodiment, the optical transmitter 200 includes a laser 240 and a laser driver 205 that is configured to drive the laser 240 using either a CDT or a VDT. The CDT 210 is illustrated on the left side and the VDT 220 is illustrated on the right side of FIG. 2. Although illustrated as a single-ended topology, the CDT and the VDT may be implemented as a differential topology.

In the illustrated embodiments, the laser driver 205 is configured to switch between the CDT 210 and the VDT 220 using a switch 230, e.g., SW and SW bar. The switch 230 may be controlled by a microprocessor. In the illustrated embodiment, the switch 230 is configured to switch between the CDT 210 and the VDT 220 based on an operating frequency/bandwidth of the optical transmitter 200. In one embodiment, the laser driver 205 switches to the CDT 210 when the operating frequency of the transmitter 200 is below 1 Gbps and to the VDT 220 when the operating frequency of the transmitter 200 is or above 1 Gbps. In another embodiment, the laser driver 205 switches to the CDT 210 when the operating bandwidth of the transmitter 200 is below 1 GHz and to the VDT 220 when the operating bandwidth of the transmitter 200 is or above 1 GHz.

In the illustrated embodiment, the CDT 210 and the VDT 220 are designed such that they may share common circuit elements. For example, common elements such as voltage and current sources, transistor and resistors may be shared. In one embodiment, the CDT 210 and the VDT 220 may be implemented as two mutually exclusive topologies.

On the left side of FIG. 2, the switch 230 is switched ON (SW bar is switched off) and the laser driver 205 is switched to the CDT 210. Under the CDT 210, the modulation current ($I_{mod}$) equals to the laser modulation driving current ($I_{mod\_LD}$). Based on the equivalent circuit of a laser 240, e.g., a vertical-cavity surface-emitting laser (VCSEL), the bandwidth of this topology can be expressed as $w_0=1/R_{out}C_{out}$, where $R_{out}$ equals to the total parasitic resistance of the VCSEL ($R_{VCSEL}=R_p//(Cs+C_j)$). The $C_{out}$ is equal to $C_{CMOS}+C_d$, where $C_{CMOS}$ represents the drain parasitic of the transistor and $C_d$ is the load capacitor which is the total parasitic capacitance of the VCSEL ($C_{VCSEL}=C_p+C_j$).

On the right side of FIG. 2, the SW 230 is switched OFF (SW bar is switched ON) and the laser driver 205 is switched to the VDT 220, targeting for a high bandwidth/frequency operation. Under the VDT 220, the modulation current ($I_{mod}$) equals the sum of the laser modulation driving current ($I_{mod\_LD}$) and the modulation driving current through the load resistor ($I_{Rd}$). The output resistance ($R_{out}$) equals to $R_d//R_{VCSEL}$, which is smaller than the value in the CDT 210. As mentioned above, while the modulation current ($I_{mod}$) is greater here than the CDT, the charging and discharging time constant ($T=R_{out} \times C_{out}$) is smaller and the 3-dB bandwidth ($w_0=1/R_{out}C_{out}$) is higher than the CDT.

Figure 3:
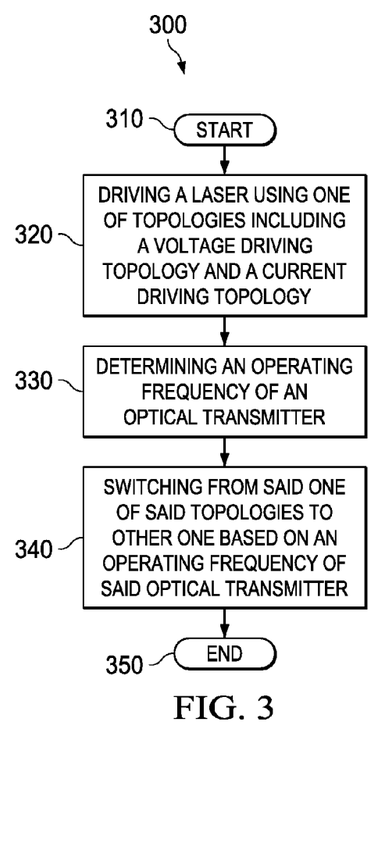
FIG. 3 illustrates a flowchart of one embodiment of a method for operating an optical transmitter, e.g., the optical transmitter in FIG. 2, that is carried out according to the principle of the disclosure.

FIG. 3 illustrates a method 300 of operating an optical transmitter, e.g., the optical transmitter 200 in FIG. 2. The method may be carried out by a laser driver, e.g., the laser driver 205 in FIG. 2, in the optical transmitter. The method starts at step 310.

At step 320, the laser driver starts to drive its laser using one of available topologies. In the illustrated embodiment, the available topologies include a current-driving topology (CDT) and a voltage driving topology (VDT). In one embodiment where a default topology is not set, the laser driver starts driving the laser using the CDT. In another embodiment, the laser driver starts driving using the VDT.

At step 330, the laser driver determines an instantaneous operating frequency/bandwidth of the transmitter. In one embodiment, the determination is made periodically with the first determination being made at the beginning of the operation. The operating frequency may be measured in bits per second, and the operating bandwidth may be measured in Hertz.

At step 340, the laser driver switches from one topology to the other topology based on the determined operating frequency/bandwidth. Although not illustrated, the laser driver compares the determined operating frequency/bandwidth to the threshold frequency/bandwidth, e.g., 1 Gbps/GHz.

In one embodiment, the driving topology is changed to the CDT when the operating frequency falls below 1 Gbps, and the driving topology is changed to the VDT when the operating frequency is or above 1 Gbps. In another embodiment, the driving topology is changed to the CDT when the operating bandwidth falls below 1 GHz, and the driving topology is changed to the VDT when the operating bandwidth is or above 1 GHz.

In the illustrated embodiment, the step 340 is carried out by a switch 230, e.g., the SW and SW bar, in FIG. 2. The switch may be controlled by a microcontroller in some embodiments. The method ends at step 350.

Figure 4A:
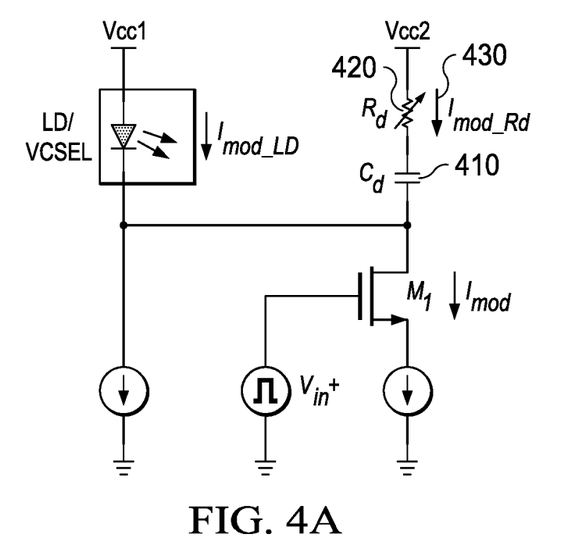
FIGS. 4A and 4B illustrate circuit diagrams of another embodiment of an optical transmitter implemented according to the principle of the disclosure.
Figure 4B:
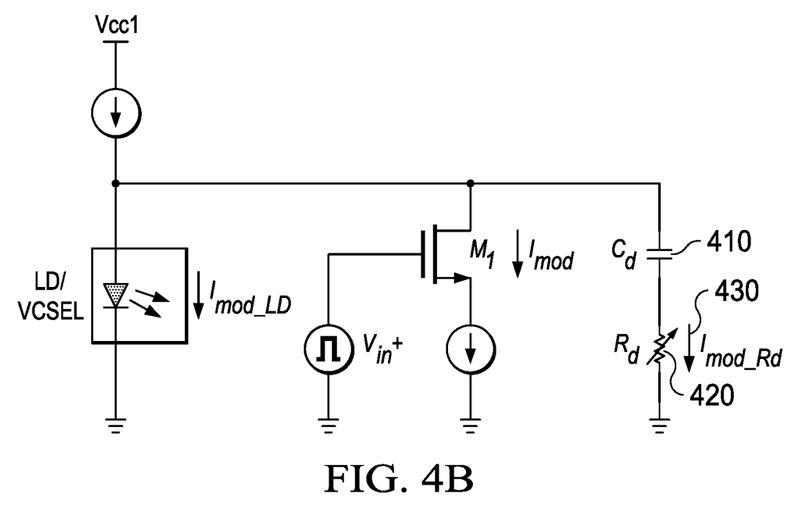

FIGS. 4A and 4B illustrate circuit diagrams of two embodiments of an optical transmitter using a hybrid topology, i.e. having characteristics of both a CDT and a VDT. A typical laser can be simply modelled as an intrinsic capacitor Cd 410 in serial with a variable resistor Rd 420. In the illustrated embodiments, with the intrinsic capacitor $C_d$ 410, there is no DC current flow through the variable load resistor Rd 420 and hence its static power consumption is reduced similar to the current-driving mode topology. However, its modulation current 430 still flows through the variable load resistor Rd 420, acting in the voltage-driving mode to achieve the high bandwidth. Based on the required bandwidth, the value of variable load resistor Rd 420 may be adjusted to optimize its power consumption.

The illustrated embodiments have additional advantages when the power supplied to the laser is different from that to the laser driver. For example, for a typical laser diode (LD)/VCSEL requires a DC supply voltage of higher than 1.5V, a low power CMOS driver that operates below 1.5V, the capacitor ($C_d$) 410 helps to prevent the DC current leakage between two different suppliers e.g., Vcc1 and Vcc2 in FIG. 4A.

Figure 5A:
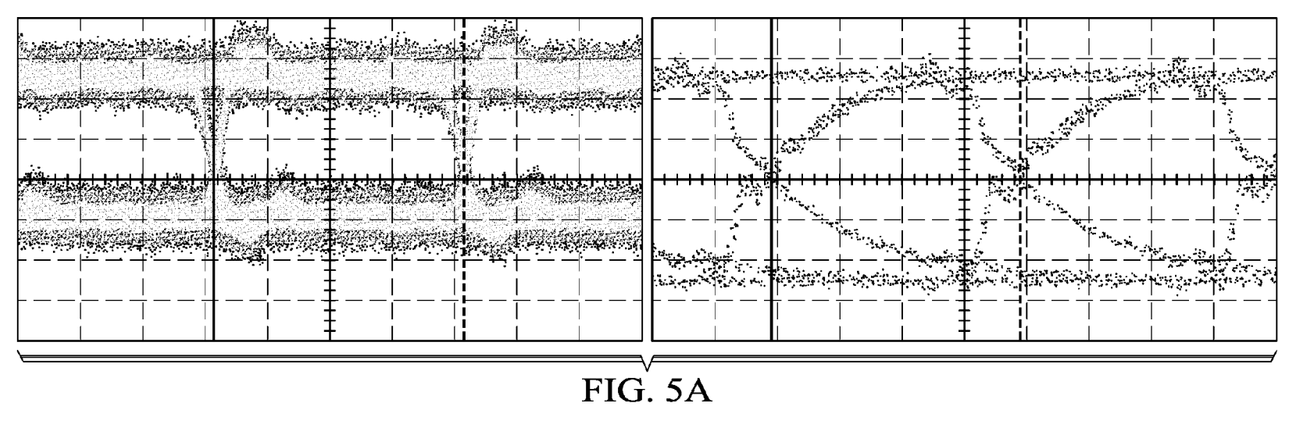
FIGS. 5A-5C illustrate optical eye diagrams for voltage-driving (left) and current-driving (right) topologies in an optical transmitter, e.g., the optical transmitter in FIG. 2, operating at 500 MHz, 1 GHz, and 1.5 GHz, respectively.
Figure 5B:
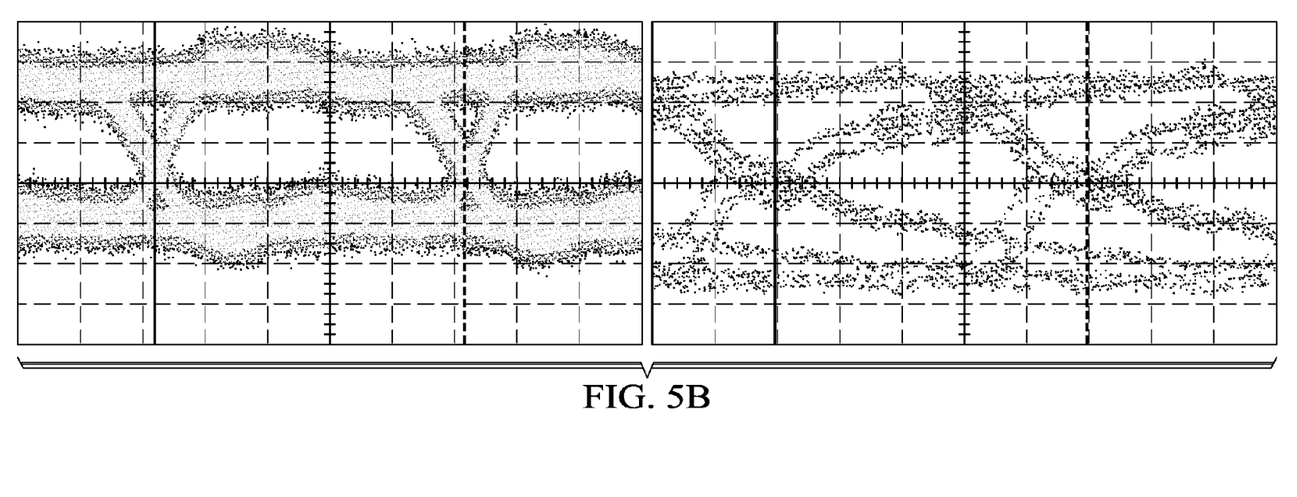
Figure 5C:
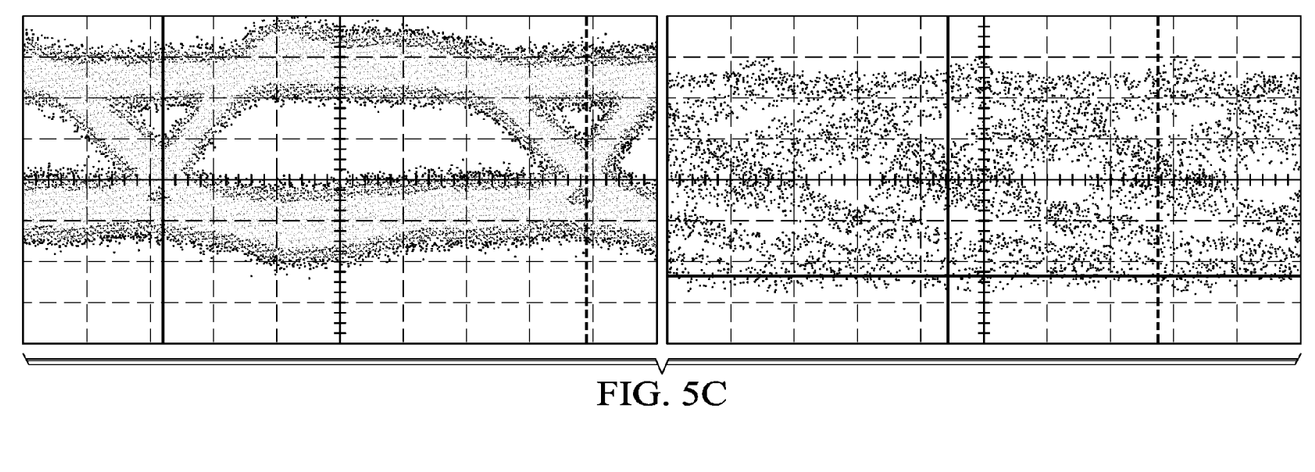

FIGS. 5A-5C show measured optical eye diagrams for (left) a VDT and (right) a CDT in an optical transmitter, e.g., the optical transmitter in FIG. 2, at operating bandwidths of 500 MHz (FIG. 5A), 1.0 GHz (FIG. 5B) and 1.5 GHz (FIG. 5C). As FIGS. 5A and B show, the measured optical eyes for the CDT are more open at lower bandwidths, e.g., 500 MHz and 1 GHz, than at the high bandwidth, e.g., 1.5 GHz. For the VDT, the measured optical eyes remain open even at the high bandwidth 1.5 GHz.

Figure 6:
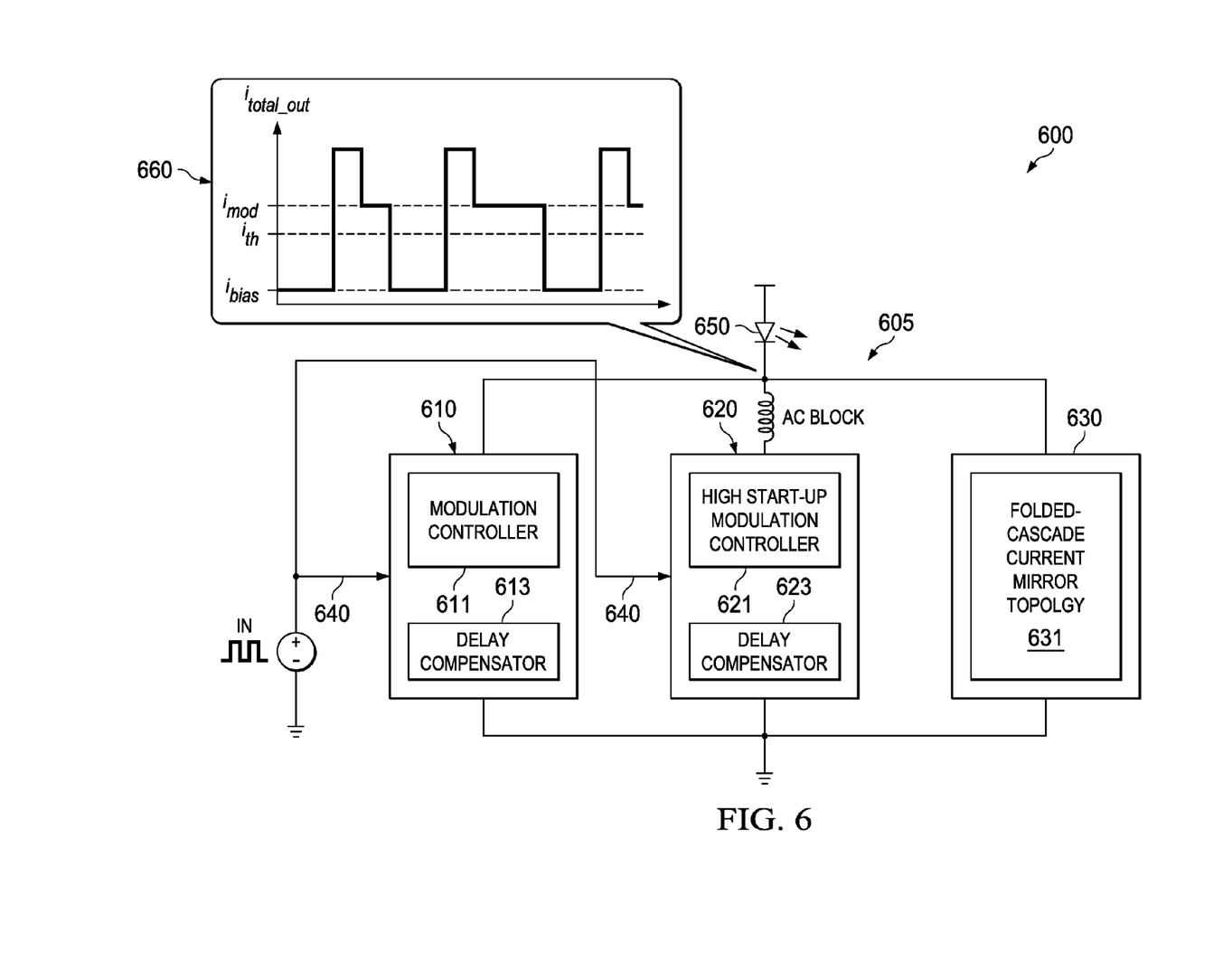
FIG. 6 illustrates a circuit diagram of one embodiment of an optical transmitter operating with a low bias current implemented according to the principle of the disclosure.

FIG. 6 illustrates an embodiment of an optical transmitter 600 having a laser driver 605 and a laser 650. In the illustrated embodiment, the laser driver 605 is configured to drive the laser 650 with a low bias current and a modified modulation current having a high start-up modulation (HSM) current pulse.

The utilization of the modified modulation current allows the optical transmitter to use the low bias current without increasing its laser's turn on delay and distorting its optical output current. As discussed above, the low bias current refers to a current that is lower than a threshold current of a laser such as zero or close to zero current.

In the illustrated embodiment, the laser driver 605 includes a modulation block 610, a high start-up modulation (HSM) block 620 and a bias current controller 630. An input data 640 is divided and fed to the modulation block 610 and the HSM block 620.

In the illustrated embodiment, the modulation block 610 includes a modulation controller 611 and a delay compensator 613. The modulation controller 611 is configured to provide a modulation current pulse from the incoming input data 640 and the delay compensation block 613 is configured to synchronize the modulation current pulse with the HSM current pulse of the HSM block 620.

In the illustrated embodiment, the HSM block 620 includes a HSM controller 621 and a delay compensator 623. The HSM controller 621 is configured to generate the HSM current pulse. The input data 640 that passes through a plurality of controllable delay cells in the HSM controller 621 is inverted and then logically "AND" with the original input data to generate the HSM current pulse. The delay compensator 623 is configured to synchronize the input data at the logical "AND" stage.

The HSM controller 621 is also configured to modify the width and amplitude of the HSM current pulse based on the operating conditions of the optical transmitter 600. In one embodiment, the width and amplitude of the HSM current pulse may be modified to compensate the turn-on delay of the laser 650. The laser 650 may be a VCSEL or a LD.

In the illustrated embodiment, the bias current block 630 is configured to generate a low bias current for the laser 650. As defined above, the low bias current is lower than a required turn-on threshold current for the laser 650. In one embodiment, the amplitude of the bias current may be adjusted based on the operating requirements, e.g., frequency and BER, of the transmitter.

In the illustrated embodiment, the bias current block 630 has a folded-cascade current mirror topology 631 that employs multiple current mirror control blocks. The folded-cascade current mirror topology 631 provides a considerable gain at a high bandwidth, and this topology is commonly used for driving a circuit with limited voltage supplier. To further improve the energy efficiency, only those current mirror control blocks that are necessary to provide the required driver current are used.

In the illustrated embodiment, the laser driver 605 is configured to generate an output current 660, i.e., $i_{total\_out}$, which is a combination of the modulation current pulse, i.e. $i_{mod}$, from the modulation block 610, the HSM current pulse from the HSM current block 620, and the bias current, i.e. $i_{bias}$. $i_{th}$ indicates the threshold current of the laser 650.

In the illustrated embodiment, the low bias current is zero or close to zero and hence, the output current 660 is a modified modulation current, which is a combination of the modulation current and the HSM current pulse.

As shown, each pulse of the output current is step-shaped and has a tall, beginning portion, i.e. HSM current portion, and a short, ending portion. The tall portion represents a sum of corresponding portions of HSM current pulse and the modulation current, and the short portion represents the rest of the modulation current pulse. The tall portion increases the rate of change at the carrier density and reduces the turn-on delay of the laser 650.

Figure 7:
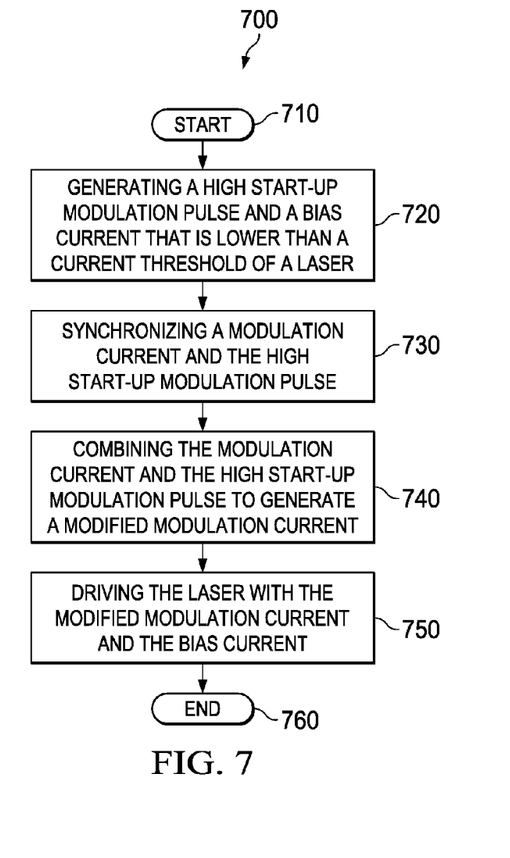
FIG. 7 illustrates a flowchart of one embodiment of a method for operating an optical transmitter, e.g., the optical transmitter in FIG. 6, carried out according to the principle of the disclosure.

FIG. 7 illustrates a method of operating an optical transmitter, e.g., the optical transmitter 600 in FIG. 6. The method may be carried out by a laser driver, e.g., the laser driver 605 in FIG. 6. The method starts at step 710.

At step 720, a high start-up modulation (HSM) current pulse and a low bias current are generated. As discussed above, the low bias current is lower than a threshold of a laser, e.g., the laser 650 in FIG. 6. In the illustrated embodiment, the low bias current is significantly lower than a typical bias current of a laser and is zero or close to zero.

It is understood that the amplitude of the bias current may be adjusted based on the operating requirements, e.g., frequency and BER, of the transmitter. As such, when the transmitter operates at a high bandwidth and requires a very low BER, a laser may be driven with a relatively high bias current (close to the normal bias current), and when the operating frequency and the BER requirement are low, a laser may be driven with a zero-bias current.

In the illustrated embodiment, the HSM current pulse is generated by a HSM controller, e.g., the HSM controller 621 in FIG. 6, and the bias current is generated by a bias current controller, e.g., the bias controller 630 in FIG. 6.

At step 730, a modulation current and the HSM current pulse are synchronized. In the illustrated embodiment, the modulation current and the HSM current pulse are synchronized by a delay compensator, e.g., the delay compensators 613 in FIG. 6.

At step 740, the modulation current and the HSM current pulse are combined to generate a modified modulation current. Pulses of the modified modulation current are step-shaped with a tall, beginning portion and a short, ending portion. As the low bias current is zero or close to zero, the tall portion substantially represents a sum of the HSM current pulse and the corresponding portion of the modulation current pulse, and the short portion substantially represents the rest of the modulation current pulse.

Although not illustrated in FIG. 7, an amplitude and width of the HSM current pulse may be changed to compensate for the turn-on delay of the laser. Such a change may be made by the HSM controller.

At step 750, the laser is driven with the modified modulation current and the low bias current. Due to the added HSM pulse of the modified modulation current, the laser driver would be able to drive the laser with the low bias current without suffering from the turn-on delay penalty. The method 700 ends at step 760.

Those skilled in the art to which this application relates will appreciate that other and further additions, deletions, substitutions and modifications may be made to the described embodiments.

It should be also appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An optical transmitter comprising:
   a laser; and
   a laser driver configured to drive said laser using either a voltage driving topology (VDT) or a current-driving topology (CDT), said laser driver including a switch configured to switch between said VDT and said CDT based on an operating frequency of said optical transmitter.

2. The optical transmitter of claim 1, wherein said switch is configured to switch to said CDT when said operating frequency is below 1 Gbps.

3. The optical transmitter of claim 1, wherein said switch is configured to switch to said VDT when said operating frequency is or above 1 Gbps.

4. The optical transmitter of claim 1, wherein a laser of the optical transmitter is a vertical-cavity surface-emitting laser.

5. The optical transmitter of claim 1, wherein said CDT and said VDT share at least one circuit element.

6. The optical transmitter of claim 1, said switch is controlled by a microcontroller.

7. A method of operating an optical transmitter, comprising:
   driving a laser using one of topologies including a voltage-driving topology (VDT) and a current-driving topology (CDT); and
   switching to other one of said topologies based on an operating frequency of said optical transmitter.

8. The method as recited in claim 7, wherein said switching includes switching to said CDT when said operating frequency falls below 1 Gbps.

9. The method as recited in claim 7, wherein said switching includes switching to said VDT when said operating frequency is or above 1 Gbps.

10. The method as recited in claim 7, further comprising determining said operating frequency.

11. The method as recited in claim 7, wherein said method is carried out using a driver circuit of said optical transmitter.

12. The method as recited in claim 7, wherein said CDT and said VDT have at least one common circuit element.

* * * * *